United States Patent [19]
Werts et al.

[11] 3,780,318
[45] Dec. 18, 1973

[54] ZERO CROSSING SCR FIRING CIRCUIT NETWORK

[75] Inventors: Everett Wendall Werts, Normal; Charles Richard Wetter, Bloomington, both of Ill.

[73] Assignee: General Electric Company, New York, N.Y.

[22] Filed: June 26, 1972

[21] Appl. No.: 266,233

[52] U.S. Cl. .............. 307/252 UA, 323/21, 323/34, 323/38
[51] Int. Cl. ............................................ H03k 17/72
[58] Field of Search ................ 307/252 UA; 323/21, 323/34, 38

[56] References Cited

UNITED STATES PATENTS

| | | | |
|---|---|---|---|
| 3,283,179 | 11/1966 | Carlisle et al. | 307/133 |
| 3,443,204 | 5/1969 | Baker | 307/252 UA |
| 3,663,950 | 5/1972 | Bartlett | 307/252 UA |

*Primary Examiner*—John Zazworsky
*Attorney*—Arthur E. Fournier, Jr. et al.

[57] ABSTRACT

A firing circuit for providing time zero crossing firing of a load-controlling SCR, adapted particularly for firing a load-controlling SCR connected in circuit relationship in a single phase of a multi-phase electrical system, including an electrical power supply, a first quad section integrated circuit means connected in circuit relationship with the power supply and including a first flip flop and a second flip flop, a second dual section integrated circuit means connected in circuit relationship with the first integrated circuit means, a photo isolator to accept a logic input from another logic system and including at least one light emitting diode connected in circuit relationship with the aforesaid logic system and a photo transistor coupled to the light emitting diode and connected in circuit relationship with the first and second integrated circuit means, and a load-controlling SCR connected in circuit relationship with the first and second integrated circuit means such that zero crossing firing of the SCR is provided in accordance with a two step process which is initiated when a logic input is fed to the firing circuit through the photo isolator and regardless of when during the cycle the logic input is supplied.

5 Claims, 3 Drawing Figures

ZERO CROSSING SCR FIRING CIRCUIT NETWORK

BACKGROUND OF THE INVENTION

1. Field of the Invention

This invention relates to circuits for firing semiconductor devices, and more particularly to an improvement of a firing circuit for providing time zero crossing firing of a silicon controlled rectifier (SCR).

2. Description of the Prior Art

The concept of zero crossing firing of alternating current or full wave rectified power circuits has at this time become accepted as the most feasible approach to the use of power SCR's for the control of a variety of different types of loads. Zero crossing firing requires that current through a SCR be established or interrupted as the alternating current or full wave rectified voltage passes through the zero value region. Switching under these conditions reduces radio frequency interference effects to a minimum and obviates the need for substantial filter circuits. Hence, circuits utilizing this concept are commonly far less expensive and operate more reliably and efficiently than circuits employing earlier forms of control techniques.

The interruption of current flow through a power SCR during the zero crossing of an applied alternating current or full wave rectified potention presents no problems since the device naturally turns OFF if the holding current through it drops below a known minimum holding value. Turn ON of a power SCR during the zero crossing interval, however, requires that the turn ON control circuit have the capability of sensing the zero crossing interval, and then turn ON the power SCR only during this interval.

Different types of circuits capable of turning ON the power SCR in the aforementioned manner are known in the art and some have also been described in the literature. Notwithstanding this fact, there exist applications for the employment of power SCR's wherein the aforereferenced circuits known in the art do not find ready utilization. Thus, for example, there exist situations wherein it is desired to fire a power SCR at the zero crossing following the application of an external signal input to the firing circuit of the SCR. It is therefore necessary in such applications that the circuit be capable of functioning such that upon receiving such an external signal input the circuit will be conditioned whereby to give time zero crossing firing of the power SCR regardless of when in the cycle the external signal input is supplied.

OBJECTS OF THE INVENTION

It is thus an object of the present invention to provide a novel and improved zero crossing firing circuit for firing a power silicon controlled rectifier (SCR).

It is another object of the present invention to provide such a zero crossing firing circuit which is adapted to fire a power SCR connected in circuit relationship in a single phase of a multi-phase electrical system.

A further object of the present invention is to provide such a zero crossing firing circuit which is adapted for connection in tandem with another one or more zero crossing firing circuits to provide zero crossing firing of the power SCR in each phase of a multi-phase electrical system.

A still further object of the present invention is to provide such a zero crossing firing circuit for firing a power SCR at the zero crossing following the application of an external signal input to the firing circuit of the SCR regardless of when in thee cycle the external signal input is supplied.

SUMMARY OF THE INVENTION

In carrying out the invention in one form, there is provided a firing circuit for providing time zero crossing firing of a power, i.e., load, silicon controlled rectifier (SCR) and adapted particularly for use where the load SCR is connected in circuit relationship in a single phase of a multiphase electrical system. The subject firing circuit includes a power supply, a first integrated circuit means, a second integrated circuit means, a photo isolator, and the load-controlling SCR to be fired. The first integrated circuit means is connected in circuit relationship with the power supply and comprises a quad section dual input NAND to provide the firing circuit with a first flip flop and a second flip flop. The second integrated circuit means is connected in circuit relationship with the first integrated circuit means and consists of a dual section multi-input NAND. The photo isolator provides a logic input to the firing circuit from an external logic system and include at least one light emitting diode connected in circuit relationship in the aforesaid logic system, and a photo transistor which is coupled to the light emitting diode and is connected in circuit relationship with the first and second integrated circuit means. The load-controlling SCR to be fired is connected in circuit relationship with the first and second integrated circuit means such that when it is desired to fire the load-controlling SCR current's passed through the light emitting diode to turn the photo transistor ON there to condition the first and second integrated circuit means of the firing circuit whereby to provide zero crossing firing of the load-controlling SCR at the zero crossing subsequent to the application of the logic input to the firing circuit regardless of when in the cycle the logic input is supplied.

The invention will be more fully understood from the following detailed description and its scope will be pointed out in the appended claims

DESCRIPTION OF A PREFERRED EMBODIMENT

Figure 1:
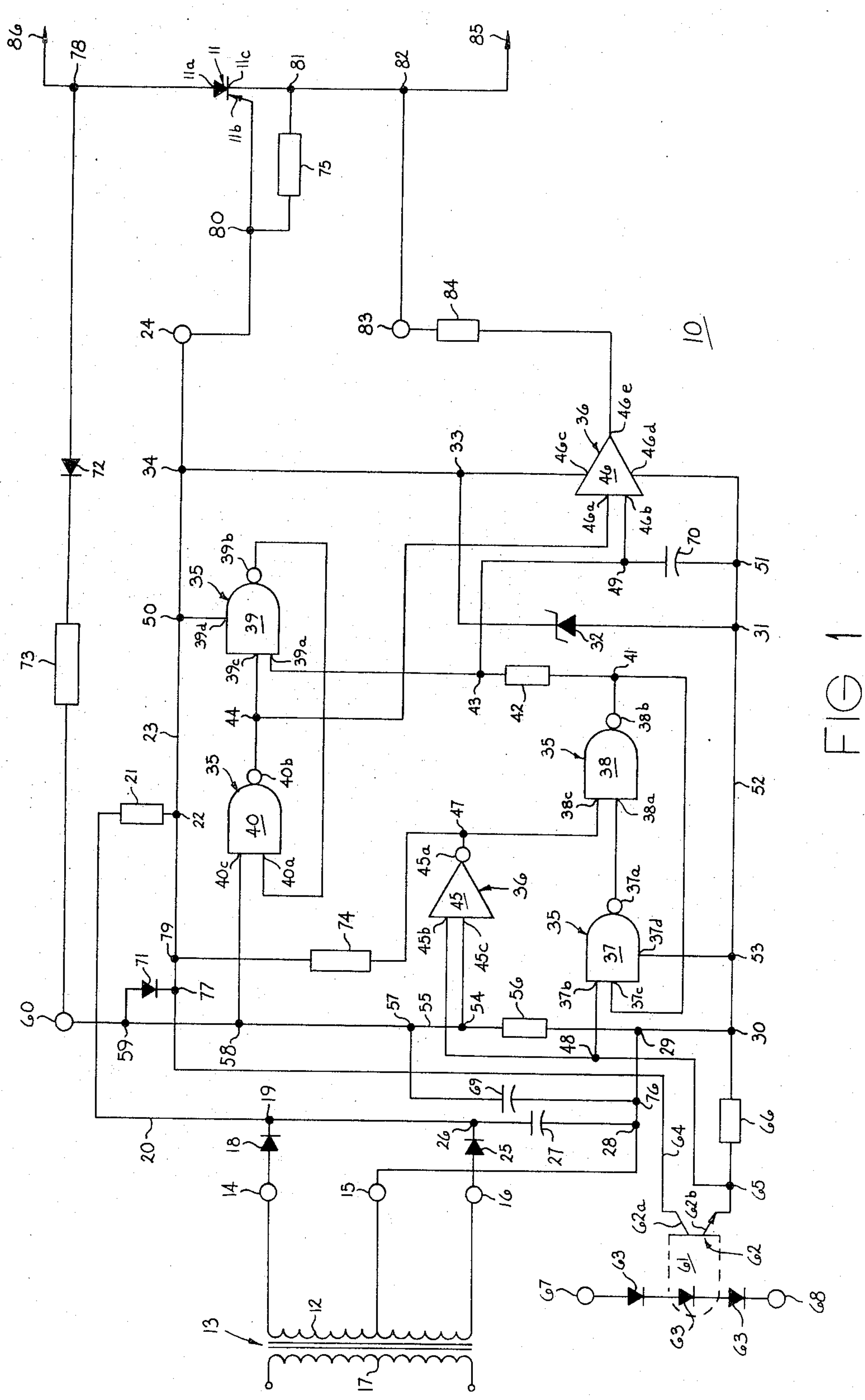
FIG. 1 is a schematic diagram of a zero crossing firing circuit for firing a semiconductor device in accordance with the present invention.

Referring to FIG. 1 of the drawing, there is illustrated therein one embodiment of the present invention comprising a time zero crossing firing circuit, generally designated by reference numeral 10, for firing a gate-controlled semiconductor device such as the silicon controlled rectifier (SCR) the latter being adapted to control the energization of a load (not shown). The firing circuit 10 is supplied with power through one winding 12 of power supply transformer 13. The winding 12 is connected to terminals 14, 15 and 16 and comprises a 30 v. winding with the center tap connected to terminal 15. In accordance with the embodiment of the invention illustrated in FIG. 1, the primary winding 17 of transformer 13 is suitably connected to a 460 v. source (not shown) of alternating current. Also in accordance with the embodiment of FIG. 1, winding 12 comprises only one of three or four windings (not shown) on the same transformer 13. Each of the latter windings (not shown) is similar to the aforedescribed winding 12 and thus each is adapted for employment independently in another zero crossing firing circuit, similar to the firing circuit 10, associated with another phase of a multiphase electrical system.

As seen in FIG. 1, terminal 14 is connected through diode 18 and junction 19 to lead 20 and thereby to one side of resistor 21. The other side of resistor 21 is connected through junction 22 and lead 23 to terminal 24. Further as illustrated in FIG. 1, terminal 16 is connected through diode 25 and junction 26 to lead 20 and thereby to one side of capacitor 27. The other side of capacitor 27 is connected in circuit through junctions 28, 29, 30 and 31 to Zener diode 32 which in turn is connected through junctions 33 and 34 and lead 23 to the aforesaid terminal 24. As such, transformer 13 with diodes 18 and 25, capacitor 27, resistor 21 and Zener diode 32 make up a constant voltage power supply for integrated circuit means 35 and 36, hereinafter described, such that zero voltage is maintained on terminal 15 and approximately +14 v. on terminal 24.

Referring further to FIG. 1, integrated circuit means 35 comprises a quad section dual input NAND of the type marketed for example by Motorola under the designation MC672L. The quad sections of integrated circuit means 35 which are specifically identified in FIG. 1 by the reference numerals 37, 38, 39 and 40, respectively, are connected together in circuit relationship with the output terminal 37*a* of quad section 37 connected to the input gate 38*a* of quad section 38, the output terminal 38*b* of quad section 38 connected through junction 41, resistor 42 and junction 43 to the input gate 39*a* of quad section 39, the output terminal 39*b* of quad section 39 connected to the input gate 40*a* of quad section 40 and with the output terminal 40*b* of quad section 40 connected through junction 44 to input gate 39*c* of quad section 39. Also, output terminal 38*b* of quad section 38 is connected through junction 41 to input gate 37*c* of quad section 37.

Insofar as concerns integrated circuit means 36, the latter comprises a dual section multi-input NAND of the type marketed for example by Motorola under the designation MC679L. For purposes of identification, the dual sections of integrated circuit means 36 are specifically designated in FIG. 1 by the numerals 45 and 46. As depicted in FIG. 1, the dual sections 45 and 46 of integrated circuit means 36 are connected in circuit relationship with the quad sections 37, 38, 39 and 40 of integrated circuit means 35. More particularly, output terminal 45*a* of dual section 45 is connected through junction 47 to input gate 38*c* of quad section 38, and input gate 45*b* of dual section 45 is connected through junction 48 to input gate 37*b* of quad section 37. In addition, input gate 46*a* of dual section 46 is connected to junction 44 to which, as described hereinabove, the output terminal 40*b* of quad section 40 and the input gate 39*c* of quad section 39 are also connected. Also, dual section 46 has its input gate 46*b* connected through junction 49 to junction 43 to which, as set forth in the preceding paragraph, output terminal 38*b* of quad section 38 and input gate 39*a* of quad section 39 are connected. Furthermore, input gate 46*c* of dual section 46 is connected through junctions 33 and 34 to lead 23 and thereby to input gate 39*d* of quad section 39 which is connected through junction 50 also to lead 23. The remaining input gate 46*d* of dual section 46 is connected through junction 51 to lead 52 to which input gate 37*d* of quad section 37 is connected by means of junction 53. With reference again to dual section 45, the latter has its input gate 45*c* connected through junction 54 to lead 55. Lead 55 is connected through resistor 56 and junctions 29 and 30 to lead 52 at one end and through junctions 57, 58 and 59 to terminal 60 at the other end. Input gate 40*c* of quad section 40 is connected to lead 55 through the aforementioned junction and thereby to input gate 45*c* of dual section 45.

Firing circuit 10 as shown in FIG. 1 of the drawing also includes a photo isolator means 61 comprising a photo transistor 62 with which one of a plurality of light emitting diodes 63 is coupled. One form of photo isolator means employable in the firing circuit 10 is marketed by Texas Instrument under the designation TIL 107. Photo transistor 62 has its collector 62*a* connected by lead 64 to lead 23 and thereby to terminal 24. The emitter 62*b* of photo transistor 62 is connected through junction 65 to resistor 66 and therethrough by means of lead 52 and junction 53 to input gate 37*d* of quad section 37 and by means of junction 51 to input gate 46*d* of dual section 46. In addition, the emitter 62*b* of photo transistor 62 is connected through junctions 65 and 48 to the input gate 37*b* of quad section 37 and to the input gate 45*b* of dual section 45. Regarding the light emitting diodes 63, the latter are connected between a pair of terminals 67 and 68 which in turn are connected in a logic system (not shown) which is external to the firing circuit 10. The light emitting diodes 63 which function in a manner to be more fully set forth hereinafter are depicted in FIG. 1 of the drawing as numbering three diodes. Only one of the three diodes 63 is necessary for the operation of firing circuit 10. The other two of the three diodes 63 which are depicted in FIG. 1 as not being coupled to photo transistor 62 are employable to activate other photo transistors (not shown) connected in circuit relationship in two other firing circuits (not shown), similar in nature to firing circuit 10, but associated with the other two phases of a three phase electrical system. However, it is to be understood that, if so desired, more than one light emitting diode 63 could be coupled to photo transistor 62 to actuate the latter, without departing from the essence of the invention.

As seen with reference to FIG. 1, firing circuit 10 further includes a pair of capacitors 69 and 70, a pair of diodes 71 and 72, and three resistors 73, 74 and 75. Capacitor 69 is connected between junction 57 and thereby to lead 55 and junction 76, while capacitor 70 is connected between junction 43 and junction 51 and thereby to lead 52. Capacitors 69 and 70 serve to suppress electrical noise and provide a small phase shift in the relation of pulses in the firing circuit 10. This is needed to take care of tolerance of the operation voltage of the integrated circuit means 35 and 36. Diode 71 is connected through junction 59 to terminal 60 and through junction 77 to lead 23, while diode 72 is connected through resistor 73 to terminal 60 and through junction 78 to the anode 11*a* of power SCR 11. Diode 71 functions to clamp terminal 60 to the positive (+) bus, i.e., lead 23 to prevent the potential at input gate 40*c* of quad section 40 from getting very much higher than the potential at input gate 39*d* of quad section 39. Otherwise, excessive voltage at input gate 40*c* might destroy the quad section 40 and thereby the integrated circuit means 35. It will be noted with reference to FIG. 1 that diode 72 is connected in circuit with the anode 11*a* of SCR 11 in such a direction as to permit current flow from the anode 11*a* of SCR 11 to the current limiting resistor 73 to terminal 60. Resistor 74 is connected between junction 79 and thereby lead 23, and junction 47 and thereby the output terminal 45*a* of dual section 45. Resistor 75 is connected between junctions 80 and 81 and thereby from the gate 11*b* to the cathode 11*c* of SCR 11. In the embodiment of the invention depicted in FIG. 1, resistor 75 comprises a 22 ohms, ½ watt resistor. Resistor 75 functions to greatly reduce misfiring of the SCR 11 due to electrical noise turning the SCR 11 ON at the wrong time and to provide a path for current coming in terminal 60 through diode 71 and terminal 24 back to the cathode 11*c*. Finally, it will be noted from FIG. 1 that the cathode 11*c* of SCR 11 is connected in circuit relationship through junction 82, terminal 83 and resistor 84 to output terminal 46*e* of dual section 46. Leads 85 and 86 which as shown in FIG. 1 are connected to the cathode 11*c* and anode 11*a*, respectively, of SCR 11 are connectable respectively to the load (not shown) intended to be controlled by SCR 11 and one of the power lines.

Turning now to a consideration of the mode of operation of zero crossing firing circuit 10, in the normal OFF state transformer 13 is energized. The photo isolator means 61 does not have current through the light emitting diode 63 coupled to photo transistor 62 so the photo transistor 62 is in the OFF, i.e., high resistance state. Power SCR 11 is also OFF. Input gate 40*c* of quad section 40 and input gate 45*c* of dual section 45 see a half wave 60 HZ signal, or any other frequency that the SCR 11 is working at, to turn them ON one-half of the time. Resistor 56 pulls input gates 40*c* and 45*c* toward zero enough to turn them OFF when terminal 60 and SCR anode 11*a* are near zero voltage with reference to terminal 15. Input gate 45*b* of dual section 45 and input gate 37*b* of quad section 37 are turned OFF by resistor 66. The low signal on input gate 37*b* forces output terminal 37*a* of quad section 37 and input gate 38*a* of quad section 38 to go to a high state. The low signal on input gate 45*b* forces output terminal 45*a* of dual section 45 and input gate 38*c* of quad section 38 to go high. This combination of inputs on quad section 38 forces output terminal 38*b* of quad section 38 and input gate 37*c* of quad section 37 to go low. The low signal at output terminal 38*b* is continued through resistor 42 to put a low on input gate 39*a* of quad section 39 and input gate 46*b* of dual section 46. The low on input gate 39*a* keeps output terminal 39*b* of quad section 39 and input gate 40*a* of quad section 40 high. The low signal on input gate 46*b* of dual section 46 keeps output terminal 46*e* of dual section 46 at a high state so no current flows from terminal 24 through the SCR gate 11*b*, cathode 11*c*, terminal 83, resistor 84 and output terminal 46*e*. There is a pulsing signal at the output terminal 40*b* of quad section 40, the input gate 39*c* of quad section 39 and the input gate 46*a* of dual section 46 which is 180° out of phase with the signal on terminal 60.

When it is desired to turn the SCR 11 ON, a logic signal input is provided from the external circuit connected across terminals 67 and 68 thereby causing current to be passed through the light emitting diodes 63. This results in light being emitted from the diodes 63 which is effective to activate the photo transistor 62 coupled to one of the diodes 63 thereby causing the photo transistor 62 to change to a state of low resistance, i.e., an ON condition. As a result input gate 37*b* of quad section 37 and input gate 45*b* of dual section 45 go to a high state. Then there is a wait until input gate 45*c* of dual section 45 goes high. This may be right away or up to ½ cycle later. When input gate 45*c* goes high, output terminal 45*a* of dual section 45 will go low along with input gate 38*c* of quad section 38. This forces output terminal 38*b* of quad section 38 high with input gate 37*c* of quad section 37, input gate 39*a* of quad section 39, and input gate 46*b* of dual section 46. It is to be noted that at this instant of time when input gate 45*c* just went high, input gate 40*c* of quad section 40 also went high so output terminal 40*b* of quad section 40 and input gate 46*a* of dual section 46 are each low. This prevents output terminal 46*a* of dual section 46 from going low until into the next half cycle when terminal 60 is zero. The high on output terminal 38*b* of quad section 38 seals input gate 37*c* of quad section 37 so quad section 37 is locked ON and quad section 38 is locked OFF until a loss of signal on the photo isolator means 61 occurs. When terminal 60 goes low, indicating that voltage on the SCR anode 11*a* to cathode 11*c* is zero or reversed input gate 40*c* of quad section 40 goes to zero, i.e., a low state and output terminal 40*b* of quad section 40 goes high with input gate 39*c* of quad section 39 and input gate 46*a* of dual section 46. Output terminal 39*b* of quad section 39 goes low to seal quad sections 39 and 40 on input gate 40*c*. With input gates 46*a* and 46*b* of dual section 46 now high, output terminal 46*e* of dual section 46 will go low to draw current through the gate 11*b* - cathode 11*c* of the SCR 11. The signal on terminal 60 is removed by the SCR 11 being ON, but the quad sections of integrated circuit means 35 stay in the same state due to the latching of quad sections 37 and 38, and quad sections 39 and 40. A continuous D.C. current is passed through the SCR gate 11*b* - cathode 11*c* of sufficient magnitude to keep the power SCR 11 turned full ON whenever forward voltage appears at the anode 11*a* to cathode 11*c* of SCR 11.

When it is desired to turn the power SCR 11 back OFF, the photo isolator means 61 is turned OFF. That is, the logic signal input provided across terminals 67 and 68 is terminated. With photo transistor 62 turned OFF, i.e., in a high resistance state, input gate 37*b* of quad section 37 and input gate 45*b* of dual section 45 go low. This puts output terminal 45*a* of dual section 45, input terminal 38*c* of quad section 38, output terminal 37*a* of quad section 37, input gate 38*a* of quad section 38 high and output terminal 38*b* of quad section 38 goes low with input gate 37*c* of quad section 37, input gate 39*a* of quad section 39 and input gate 46*b* of dual section 46 following low. The output terminal 46*e* of dual section 46 goes high to turn the SCR 11 OFF. The quad sections 39 and 40 of integrated circuit means 35 are unlocked to wait for the next time for them to go ON.

Figure 2:
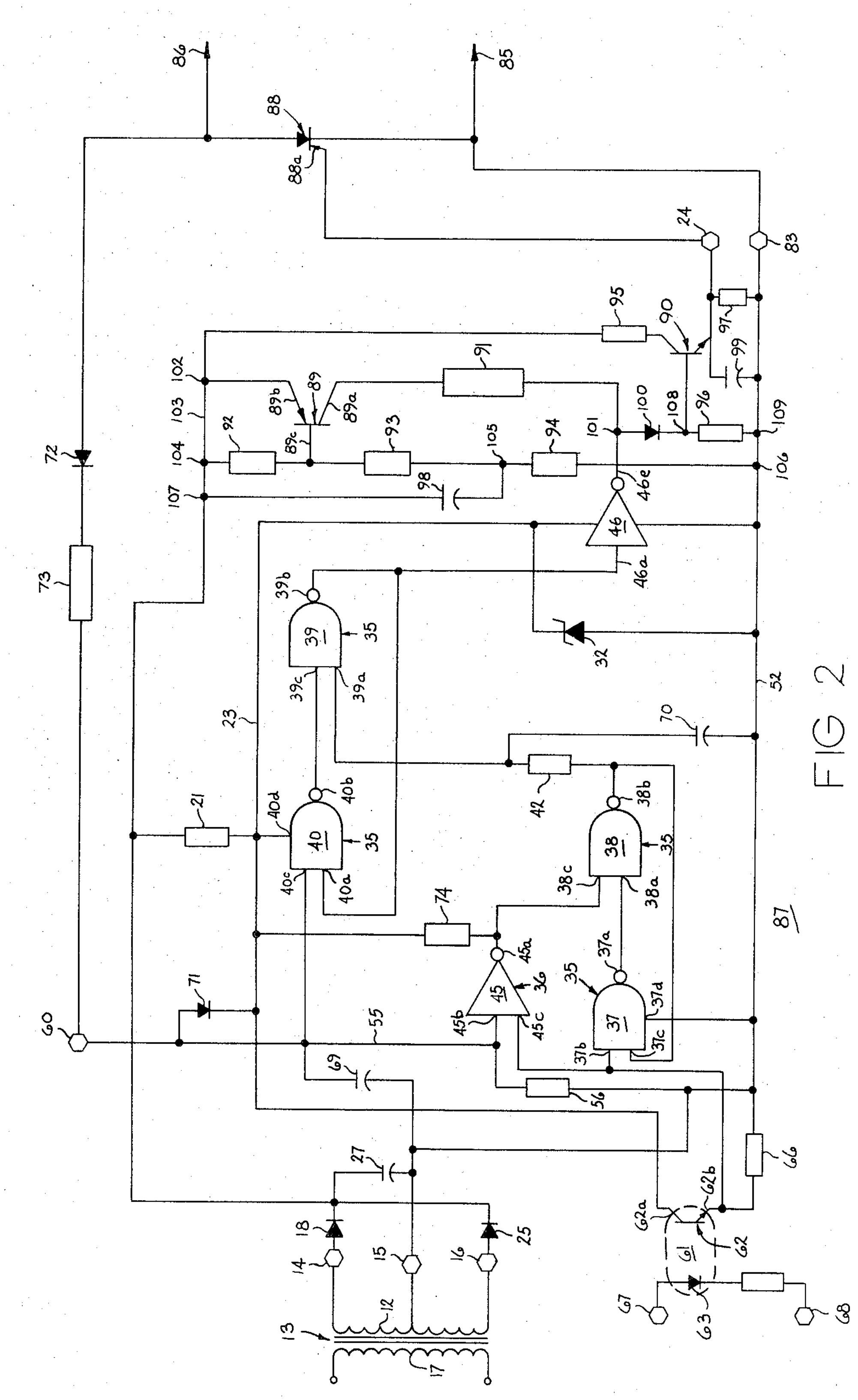
FIG. 2 is a schematic diagram of another embodiment of a zero crossing firing circuit for firing a semiconductor device in accordance with the present invention.

Referring now to FIG. 2 of the drawing, there is illustrated therein another embodiment of a zero crossing firing circuit in accordance with the present invention. The firing circuit of FIG. 2, generally designated therein by reference numeral 87, is particularly adapted for application in connection with one phase of multi-phase electrical systems wherein it is desired to fire larger semiconductor devices which necessitate a higher value of D.C. turn ON current than that obtainable directly from the output of dual section 46 of integrated circuit means 36 of firing circuit 10 of FIG. 1. Thus, to provide a firing circuit 87 which meets the aforesaid requirement the firing circuit 10 of FIG. 1 has been modified by the addition thereto of a transistor amplifier means connected, generally speaking and as will be set forth in more detail hereinbelow, in circuit relationship between the output terminal 46*e* of integrated circuit means 36 and the power semiconductor device to be fired, i.e., power SCR 88 in the case of firing circuit 87. Inasmuch as firing circuit 87 possesses many of the same components as firing circuit 10 such as for example the quad sections 37, 38, 39 and 40 of integrated circuit means 35, the dual sections 45 and 46 of integrated circuit means 36, and photo isolator means 61, the components which are common to both firing circuit 10 and firing circuit 87 have been identified with the same reference numeral in both FIG. 1 and FIG. 2 of the drawing. Further, inasmuch as these components which are common to both the firing circuit 10 and the firing circuit 87 function in the same manner in both circuits, it is not deemed necessary to reiterate hereinbelow, in connecteion with the description of the firing circuit 87, the mode of operation of such components in the latter circuit.

However, it is believed that note should be made of the following differences which exist between firing circuit 87 and firing circuit 10 apart from the differences therebetween reflected specifically in the addition of the aforereferenced transistor amplifier means to firing circuit 87. In this connection note will be taken that in firing circuit 87 the input gate 39*d* of quad section 39 and the input gate 46*b* of dual section 46 are not employed. Also, in firing circuit 87 quad section 40 is provided with an additional input gate 40*d* which is connected to lead 23, and input gate 46*a* of dual section 46 is connected to the output terminal 39*b* of quad section 39 rather than to junction 44 as in firing circuit 10. Finally, it will be noted that the respective circuit connections of the input gates of dual section 45 have been reversed in firing circuit 87 from that shown for firing circuit 10 in FIG. 1 of the drawing. Thus in firing circuit 87, input gate 45*b* of dual section 45 is connected to lead 55 and input gate 45*c* of dual section 45 is connected to the input gate 37*b* of quad section 37.

Referring again to FIG. 2 of the drawing, the aforesaid transistor amplifier means includes a pair of transistors 89 and 90 connected in circuit relationship between the output terminal 46*e* of dual section 46 and power SCR 88. Included in the circuitry associated with transistors 89 and 90 are resistors 91–97, capacitors 98 and 99 and diode 100. More particularly, as depicted in FIG. 2, output terminal 46*e* of dual section 46 is connected through junction 101 to resistor 91 and collector 89*a* of transistor 89. The emitter 89*b* of transistor 89 is connected through junction 102 to lead 103, while the base 89*c* of transistor 89 is connected to the mid-point of series connected resistors 92 and 93. In turn, resistor 92 is connected through junction 104 to lead 103, and resistor 93 is connected through junction 105 to resistor 94 and therethrough to junction 106 and lead 52. Capacitor 98 is connected at one end to junction 105 and at the other end through junction 107 to lead 103. With regard to transistor 90, the latter has its collector 90*a* connected through resistor 95 and junction 102 to lead 103. The base 90*b* of transistor 90 is connected to the mid-point 108 of series connected diode 100 and resistor 96 and thereby through junction 101 to the output terminal 46*e* of dual section 46 and through junction 109 to lead 52.

Considering now the mode of operation of firing circuit 87, the quad sections 37, 38, 39 and 40 operate the same as in firing circuit 10. However, since in firing circuit 87 input gate 46*a* of dual section 46 is connected to output terminal 39*b* of quad section 39 rather than to input gate 39*c* thereof as in firing circuit 10, the output terminal 46*e* of dual section 46 is normally low with the SCR 88 turned OFF. This removes base drive on the output transistor 90 by diverting the current through transistor 89 and resistor 91 to 0 volts. Transistor 89 is prevented from going ON for the first few milliseconds after power is applied to the circuit by resistor 94 and the charging time of capacitor 98. This prevents a momentary turn ON of the output SCR 88, when power is applied to SCR 88 and to the control transformer 13 at the same time. After this initial period, transistor 89 stays ON with its base drive coming through resistors 93 and 94. Resistor 97 and capacitor 99 are provided across the gate 88*a* of SCR 88 to prevent misfiring of SCR 88. The current for the SCR gate 88*a* is taken directly off of the filter capacitor 27 through current limiting resistor 95 when transistor 90 is turned ON.

When it is desired to turn ON the SCR 88, a logic signal input is provided from the external circuit connected across terminals 67 and 68 thereby causing current to be passed through the light emitting diode 63. This results in light being emitted from the diode 63 which is effective to actuate the photo transistor 62 coupled to the diode 63 thereby causing the photo transistor 62 to change to a state of low resistance, i.e., an ON condition. As a result, the same signals come through quad sections 37, 38, 39 and 40 and dual section 45 as those set forth hereinabove in connection with the description of firing circuit 10. This results in the output terminal 39*b* of quad section 39 being in the low state with input gate 46*a* of dual section 46 also low. Output terminal 46*e* of dual section 46 is then in the high, or non-conducting state. Current flows through transistor 89, resistor 91, diode 100, the base of transistor 90 and the SCR gate 88*a* to turn ON transistor 90 and the SCR 88.

When it is desired to turn the power SCR 88 back OFF, the photo isolator means 61 is turned OFF. That is, the logic signal input provided across terminals 67 and 68 is terminated. This effectuates a change in the state of the integrated circuit means 35 and 36 of firing circuit 87 to that set forth above in connection with the description of firing circuit 10 for the condition corresponding to when SCR 11 is turned OFF. Thus by the addition of transistor amplifier means in circuit relationship with the output terminal 46*e* of dual section 46, the value of D.C. current can be kept high enough to keep the SCR 88 turned ON even if the load causes momentary current reverses.

Figure 3:
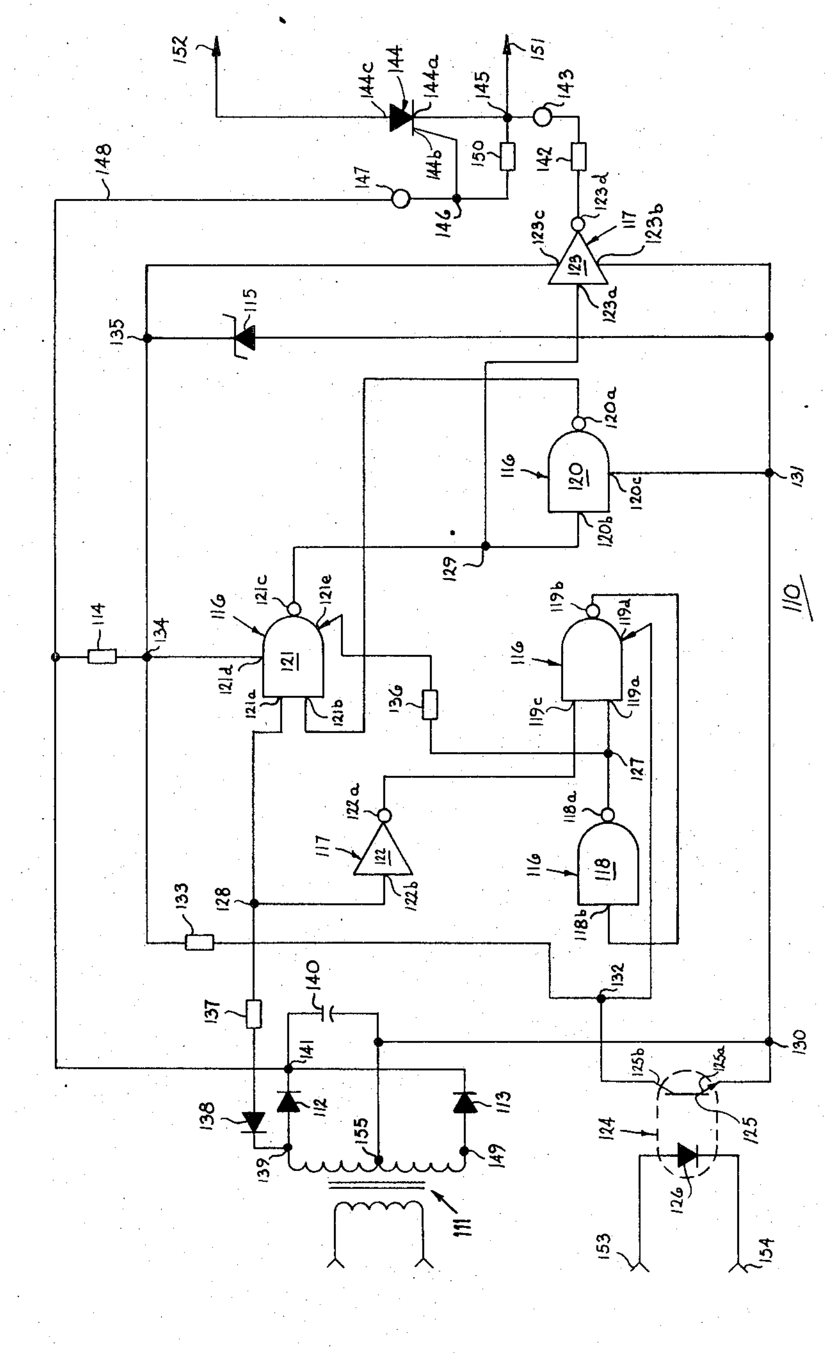
FIG. 3 is a schematic diagram of a further embodiment of a zero crossing firing circuit for firing a semiconductor device in accordance with the present invention.

Turning now to a consideration of FIG. 3 of the drawing, there is depicted therein a further embodiment of a zero crossing firing circuit in accordance with the present invention. The firing circuit of FIG. 3, generally designated therein by reference numeral 110 includes a power supply comprised of transformer 111, diodes 112 and 113, dropping resistor 114, and Zener diode 115. In addition, firing circuit 110 includes two integrated circuit means 116 and 117 wherein integrated circuit means 116 consists of quad section 118, sections 120 and 121, and integrated circuit means 117 consists of dual sections 122 and 123. In accordance with the embodiment of the invention depicted in FIG. 3, integrated circuit means 116 may be an integrated circuit of the type marketed by Motorola under the designation MC668 and integrated circuit means 117 may be an integrated circuit of the type marketed by Motorola under the designation MC679. Firing circuit 110 further includes a photo isolator means 124 comprising a photo transistor 125 coupled to a light emitting diode 126. A photo isolator means of the type employable in firing circuit 110 is marketed by Texas Instrument under the product designation TIL 107.

Referring to FIG. 3, integrated circuit means 116 and 117 are connected in circuit relationship such that output terminal **118*a* of quad section 118 is connected through junction 127 to input gate 119*a* of quad section 119, output terminal 119*b* of quad section 119 is connected to input gate 118*b* of quad section 118, input gate 119*c* of quad section 119 is connected to output terminal 122*a* of dual section 122, input gate 122*b* of dual section 122 is connected through junction 128 to input gate 121*a* of quad section 121, input gate 121*b* is connected to output terminal 120*a* of quad section 120, and output terminal 121*c* of quad section 121 is connected through junction 129 to input gate 120*b* of quad sectiOn 120 and input terminal 123*a* of dual section 123. It is also seen from FIG. 3 that emitter 125*a* of photo transistor 125 is connected through junctions 130 and 131 to input gate 120*c* of quad section 120 and input gate 123*b* of dual section 123. Collector 125*b* of photo transistor 125 on the other hand is connected through junction 132 to input gate 119*d* of quad section 119, and through resistor 133 to junction 134 and thereby to input gate 121*d* of quad section 121, and through junction 135 to input gate 123*c* of dual section 123. Input gate 121*e* of quad section 121 is connected through resistor 136 to junction 127 which as noted above interconnects output terminal 118*a* of quad section 118 to input gate 119*a* of quad section 119. Junction 128 which interconnects input gate 122*b* of quad section 122 and input gate 121*a* of quad section 121 is connected through resistor 137 and diode 138 to terminal 139 of transformer 111, to which terminal in turn one side of capacitor 140 is connected through junction 141 and diode 112. Finally, output terminal 123*d* of dual section 123 is connected through resistor 142 to terminal 143. Cathode 144*a* of power SCR 144 is connected through junction 146 to terminal 147 which is connected by means of lead 148 and junction 141 to diode 113 and therethrough to terminal 149 of transformer 111. Resistor 150 is connected through junctions 145 and 146 across the cathode 144*a* and gate 144*b* of power SCR 144. Leads 151 and 152, which are connected to the cathode 144*a* and anode 144*c*, respectively, of SCR 144, provide a means of connecting SCR 144 in circuit relationship with a load to be controlled thereby which in turn is connected in circuit in one phase of a multi-phase electrical system. Terminals 153 and 154 interconnect light emitting diode 126** to an external electrical circuit such as to permit a logic signal input to be provided thereacross for a purpose to be set forth more fully hereinbelow.

When it is desired to turn ON the SCR 144, a logic signal input is applied across terminals 153 and 154 thereby causing current to pass through light emitting diode 126 whereby the latter emits light which is received by the photo transistor 125 which is coupled to diode 126. This lowers the resistance of photo transistor 125 to put input gate **119*d* of quad section 119 low. When terminal 149 of transformer 111 goes more than about 7 volts positive with respect to terminal 155 of transformer 111, output terminal 119*b* of quad section 119 goes low to drive input gate 118*b* of quad section 118 low and seal output terminal 118*a* high as long as there is a logic signal input to photo isolator means 124. This puts input gate 121*e* of quad section 121 low permitting the signal at input gates 121*a* and 121*b* of quad section 121 to be conditioned for the next low signal. This comes one half cycle later in the power supply to make output terminal 121*c* of quad section 121 high. Output terminal 120*a* of quad section 120 then goes low to seal the input of quad section 121 regardless of the signal from the diode 138. When input gate 123*a* of dual section 123 goes high, output terminal 123*d* of dual section 123 goes low to draw current through the SCR gate 144*b* from the D.C. supply. This continues as D.C. current until it is desirable to turn the SCR 144 OFF which is accomplished by terminating the logic signal input applied to photo isolator means 124 thereby causing photo transistor 125** to change back to a state of high resistance.

The aforedescribed two step process is used to ensure that when the second flip flop comprised of quad sections 120 and 121 of integrated circuit means 116 goes ON the anode **155*c* of the SCR 144 is negative with respect to its cathode 144*a*. D.C. current to the gate 144*b* of SCR 144 at this time will provide anode current just as soon as the anode 144*c* goes positive on the SCR 144 to give time zero volt crossing firing of the SCR 144 regardless of when during the cycle the logic signal input was applied. Regarding further firing circuit 110, it should be noted that the latter circuit is phase sensitive. That is, particular attention must be directed to ensuring that the transformer 111 is carefully connected to the same phase of the multi-phase electrical system as that in which the SCR to be turned ON is connected. This is in contrast to firing circuit 10 which is not phase sensitive. To accomplish this in the latter circuit, resistor 73 and diode 72 have been connected to the anode 11*a* of SCR 11 rather than to a terminal of the power supply transformer as in the case of resistor 137 and diode 138 in firing circuit 110**.

Thus in accordance with the present invention there has been provided a novel and improved zero crossing firing circuit for firing a power silicon controlled rectifier (SCR). Further, in accord with the present invention such a firing circuit has been provided which is adapted to fire a power SCR connected in circuit relationship in a single phase of a multi-phase electrical system. Moreover, the firing circuit of the subject invention is adapted for connection in tandem with another one or more zero crossing firing circuits to provide zero crossing firing of the power SCR in each phase of a multi-phase electrical system. In addition, the firing circuit in accordance with the present invention is characterized by its ability to fire a power SCR at the zero crossing following the application of an external signal input to the firing circuit of the SCR regardless of when in the cycle the external signal input is applied.

While several embodiments of our invention have been shown, it will be appreciated that modifications may be readily made thereto, some of which have been alluded to hereinabove, by those skilled in the art. For example, the logic signal may be imparted to the firing circuit by means other than a photo isolator. In this connection, a reed switch or other means capable of providing a logic signal with voltage isolation may be utilized in place of the photo isolator means 61 described hereinabove and illustrated in the drawing. We therefore intend by the appended claims to cover all such modifications which fall within the true spirit and scope of our invention.

What we claim as new and desire to secure by letters Patent of the United States is:

1. A zero crossing firing circuit for a gate controlled semi-conductor device having an anode and cathode comprising.

a. first and second flip flops, each of said flip flops having first and second inputs and an output, the output of said first flip flop being electrically coupled to said second input of said second flip flop;

b. a first gating means having at least a first input and an output, the output of said first gating means being electrically coupled to said first input of said first flip flop;

c. a second gating means having at least one input electrically coupled to the output of said second flip flop and an output electrically coupled across the gate to cathode of said device; and d. whereby upon application of a logic signal to at least said second input of said first flip flop and a signal of one polarity from across the anode and cathode of said device to said first inputs of said second flip flop and said first gating means, said circuit is set to await the arrival of the next zero crossing of the anode to cathode signal, and when the anode to cathode signal attains a magnitude of approximately zero potential the output of said second gating means changes potential and causes said device to fire thereby assuring that the firing of said circuit is dependent on the zero crossing of the anode to cathode signal and independent of the time of arrival of the logic signal.

2. A circuit according to claim 1 further comprising amplifying means interposed between the output of said second gating means and the gate of said device.

3. A circuit according to claim 1 wherein said first gating means includes a second input electrically coupled to said second input of said first flip flop.

4. A circuit according to claim 1 wherein said second gating means includes a second input electrically coupled to the output of said first flip flop.

5. A circuit according to claim 1 where each of said first and second flip flops includes means for latching their respective outputs to a fixed signal level when said circuit has been set to await the zero crossing of the anode to cathode signal, and for unlatching their respective outputs upon removal of the applied logic signal from said second input of said first flip flop.

* * * * *